United States Patent
Huang

(10) Patent No.: US 6,359,489 B1
(45) Date of Patent: Mar. 19, 2002

(54) CLOCK SIGNAL GENERATION AND BUFFER CIRCUIT HAVING HIGH NOISE IMMUNITY AND LOW POWER CONSUMPTION

(75) Inventor: Ming-Huang Huang, Hsinchu Hsien (TW)

(73) Assignee: Silicon Integrated Systems Corp., Hsinchu (TW)

( * ) Notice: Subject to any disclaimer, the term of this patent is extended or adjusted under 35 U.S.C. 154(b) by 0 days.

(21) Appl. No.: 09/679,985

(22) Filed: Oct. 5, 2000

(51) Int. Cl.[7] .................................................. H03K 3/00
(52) U.S. Cl. .................................... 327/291; 331/108 R
(58) Field of Search ................................... 327/291, 294, 327/295, 298, 299, 399, 419, 434; 331/108 R, 158, 60

(56) References Cited

U.S. PATENT DOCUMENTS 5,012,141 A * 4/1991 Tomisawa .................... 327/394
5,663,675 A * 9/1997 O'Shaughnessy ............ 327/553
6,061,804 A * 5/2000 Hirai .......................... 713/501
6,072,345 A * 6/2000 Ooishi ......................... 327/157

* cited by examiner

Primary Examiner—Toan Tran
Assistant Examiner—Linh Nguyen

(57) ABSTRACT

A crystal oscillator circuit includes an oscillator gain stage, an intermediate amplifier, a high frequency noise filter, an output buffer and a power supply noise filter. The oscillator gain stage has a voltage reduction circuit for adjusting the voltage swing level of a generated clock signal. The generated clock signal is amplified by the intermediate amplifier and the high frequency noise filter filters the amplified signal. The power supply noise filter removes noise in the power supplied to the oscillator gain stage and the intermediate amplifier. The high frequency noise filter has two noise filtering circuits and a time-delay circuit. The time-delay circuit prevents two transistors in the output buffer from being turned on simultaneously to avoid large short circuit current and save power.

19 Claims, 5 Drawing Sheets

CLOCK SIGNAL GENERATION AND BUFFER CIRCUIT HAVING HIGH NOISE IMMUNITY AND LOW POWER CONSUMPTION

FIELD OF THE INVENTION

The present invention relates to a crystal oscillator circuit and more particularly to a clock signal buffer of a crystal oscillator circuit that has high noise immunity and requires low power.

BACKGROUND OF THE INVENTION

As the modern electronic technology continues to advance, smaller and sophisticated electronic devices such as cellular phones and personal digital assistants are developed to meet popular demand in the market. The electronic devices are built with complex mixed signal chips that may be used in a noisy environment. In addition to the requirements of small volume and light weight, these devices have to be immune to noise and consume low power.

An important circuit that exists in almost every modern electronic device is a clock signal generator which is usually made of a crystal oscillator circuit. A clock signal generator provides the basic timing control signal in an electronic circuit. A complex mixed signal chip used in an advanced electronic device often has to support an event-triggered wake-up function during a power saving mode. For the device to function properly, it is critical that the clock signal generator can be immune to noise and consumes little power.

FIG. 5 shows a conventional crystal oscillator circuit. The circuit has an oscillator gain stage 510 and an output buffer 520. If the circuit is used in a chip that comprises high pin count or high gate count, large noise is frequently generated when the output buffer 520 is in a switching state or the core logic is in a transition state. The nose is coupled to its power supply, ground node, or other signal lines. As a result, the output clock signal of a conventional crystal oscillator circuit may also have the noise that prevents the electronic system from working properly and sometimes even causes the system to break down.

In addition to the drawback of noise, in the circuit as shown in FIG. 5 the output buffer 520 includes two MOS transistors that may be turned on at the same time in its switching state. At some instance during the switching state, large short circuit current occurs when the two transistors are turned on simultaneously. Consequently, much power is wasted by the conventional crystal oscillator circuit.

SUMMARY OF THE INVENTION

This invention has been made to overcome the above-mentioned drawbacks in the conventional crystal oscillator circuit. The primary object of the invention is to provide a crystal oscillator circuit that can be effectively immune to noise. A high frequency noise filter as well as a power supply noise filter are used in the buffer circuit of the present invention to improve the noise immunity of the circuit.

According to the present invention, the crystal oscillator circuit comprises an oscillator gain stage, a high frequency noise filter, an intermediate amplifier, an output buffer and a power supply noise filter. A voltage reduction circuit is provided in the oscillator gain stage to adjust and optimize the level of the voltage swing of the generated clock signal. An intermediate amplifier amplifies the generated clock signal. The high frequency noise filter then filters the clock signal. The output buffer further buffers and amplifies the clock signal to generate the output clock signal.

Another object of the invention is to provide a crystal oscillator circuit that saves power. Accordingly, the high frequency noise filter includes a time-delay circuit to ensure that the two transistors in the output buffer are not turned on simultaneously to avoid large short circuit current in the switching state. Consequently, the power consumption of the crystal oscillator circuit of this invention is greatly reduced.

Other features, objects and advantages of the invention will become better understood from the following detailed description of the invention which refers to the accompanying drawings.

DETAILED DESCRIPTION OF THE PREFERRED EMBODIMENTS

Figure 1:
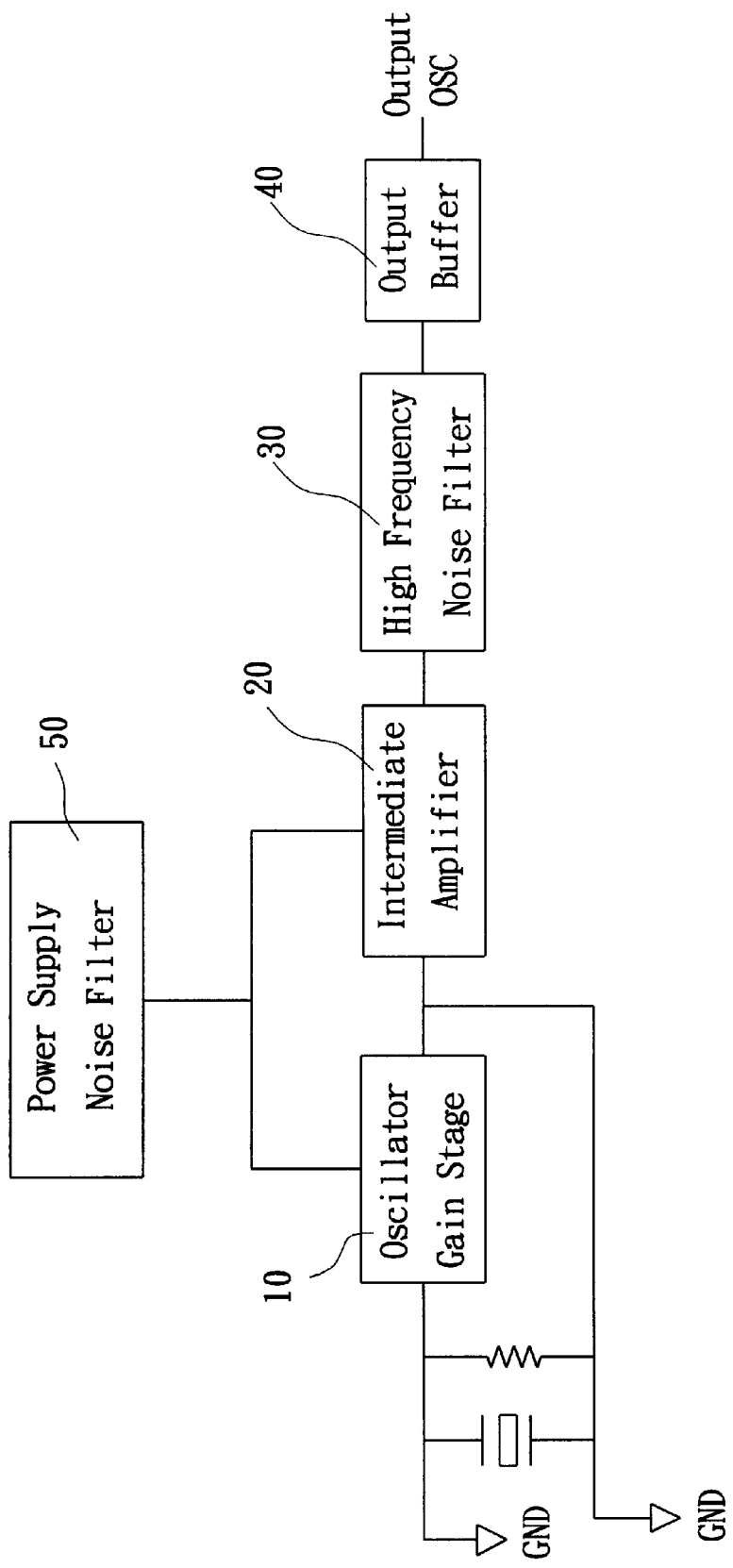
FIG. 1 shows a block diagram of the crystal oscillator circuit according to the present invention.

FIG. 1 shows a block diagram for the crystal oscillator circuit of the present invention. It comprises an oscillator gain stage 10, an intermediate amplifier 20, a high frequency noise filter 30, an output buffer 40 and a power supply noise filter 50. The clock signal of this circuit is generated from a crystal oscillator as shown in the diagram. After processing by the circuit of this invention, the clock signal is amplified and filtered to form an output clock signal that has high driving power and low noise.

Figure 2:
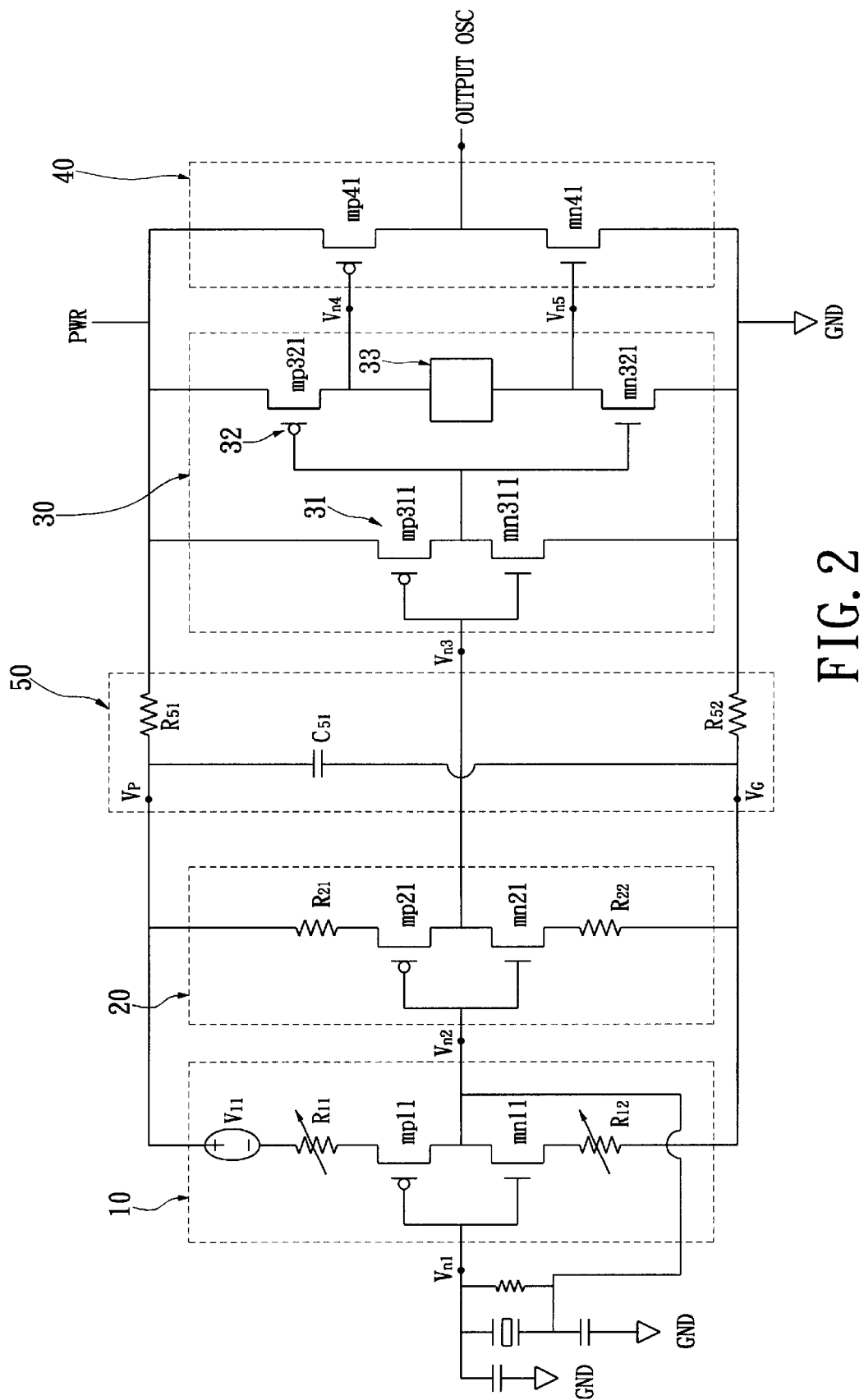
FIG. 2 shows a preferred embodiment of the crystal oscillator circuit according to the present invention.

With reference to FIG. 2, a preferred embodiment for of this invention is shown. The oscillator gain stage 10 comprises MOS transistors mp11, mn11, a plurality of adjustable current limiting resistors R11, R12 and at least a voltage reduction circuit V11 in series. The two MOS transistors mp11 and mn11 form an inverter. The voltage reduction circuit V11 reduces the voltage level supplied to the inverter and the resistors R11 and R12 limit the current flowing through the inverter. By means of the voltage reduction circuit V11 as well as the current limiting resistors R11 and R12, the MOS transistors mp11 and mn11 can be controlled to operate in a working condition that requires very minimum current flow.

FIG. 4 illustrates two preferred embodiments of adjustable current limiting resistors that include a plurality of resistors and switches connected in parallel. By turning on or off some of the switches, proper bias current can be adjusted. FIG. 4A illustrates an embodiment in which a manual switch is used. FIG. 4B illustrates an alternative embodiment in which a MOS transistor is used as the switch. FIGS. 4C–F are examples of MOS circuit that can be used as the voltage reduction circuit V11.

The intermediate amplifier 20 includes MOS transistors mp21, nm21, and two resistors R21, R22. The gates of the two MOS transistors are connected together to receive the inverted clock signal sending from the oscillator gain stage 10. The two resistors R21 and R22 limit the current flow of the intermediate amplifier 20 and the two MOS transistors mp21 and mn21 amplify the clock signal to increase its voltage level.

The high frequency noise filter 30 comprises a first high frequency noise filtering circuit 31, a second high frequency noise filtering circuit 32 and a time-delay circuit 33. The first high frequency noise filtering circuit 31 includes a PMOS transistor mp311 and an NMOS transistor mn311. The second high frequency noise filtering circuit 32 includes a PMOS transistor mp321 and an NMOS transistor mn321 with the time-delay circuit 33 connected between them.

Figure 3B:
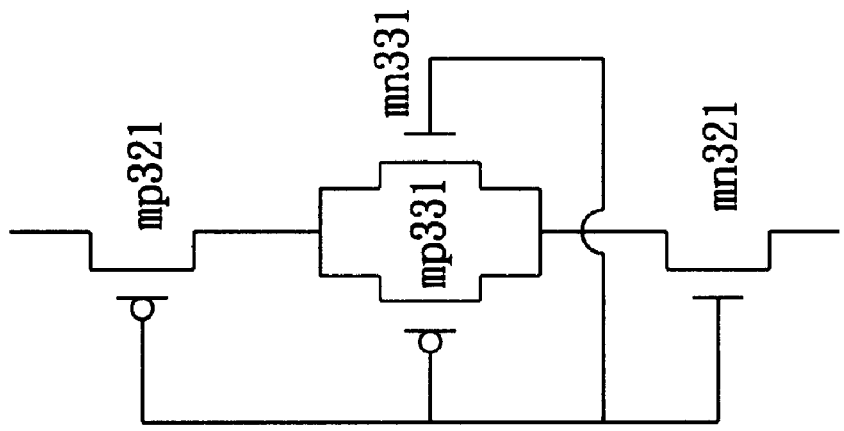
FIG. 3 shows two different embodiments of the time-delay circuit comprised in the high frequency noise filter of the present invention.
Figure 3A:
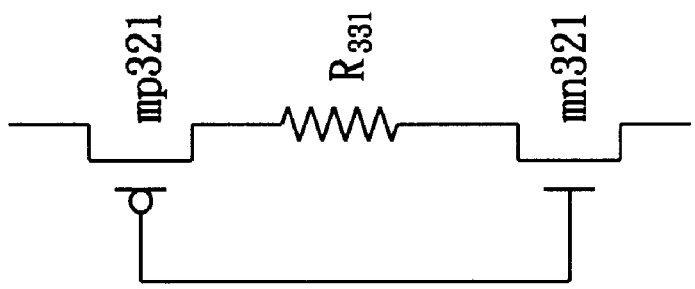
Figure 4C:
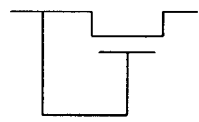
FIGS. 4C–F show examples of MOS circuits that can be used as a voltage reduction circuit.
Figure 4E:
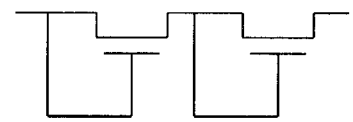
Figure 4D:
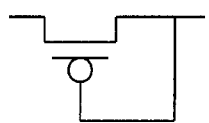
Figure 4F:
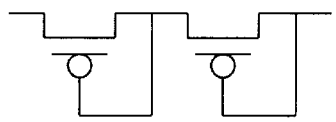
Figure 4B:
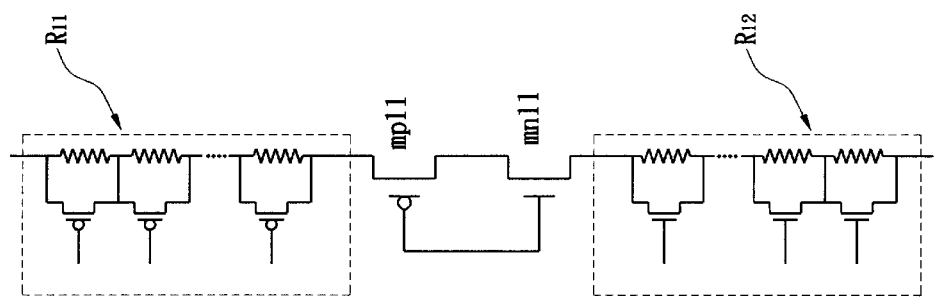
FIGS. 4A–B show two different embodiments of the adjustable current limiting resistors comprised in the oscillator gain stage of the present invention.
Figure 4A:
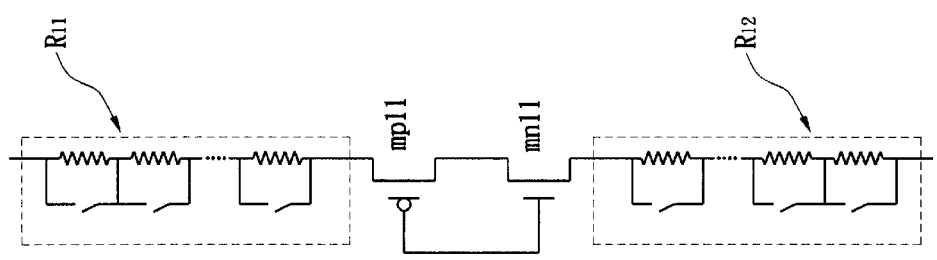
Figure 5:
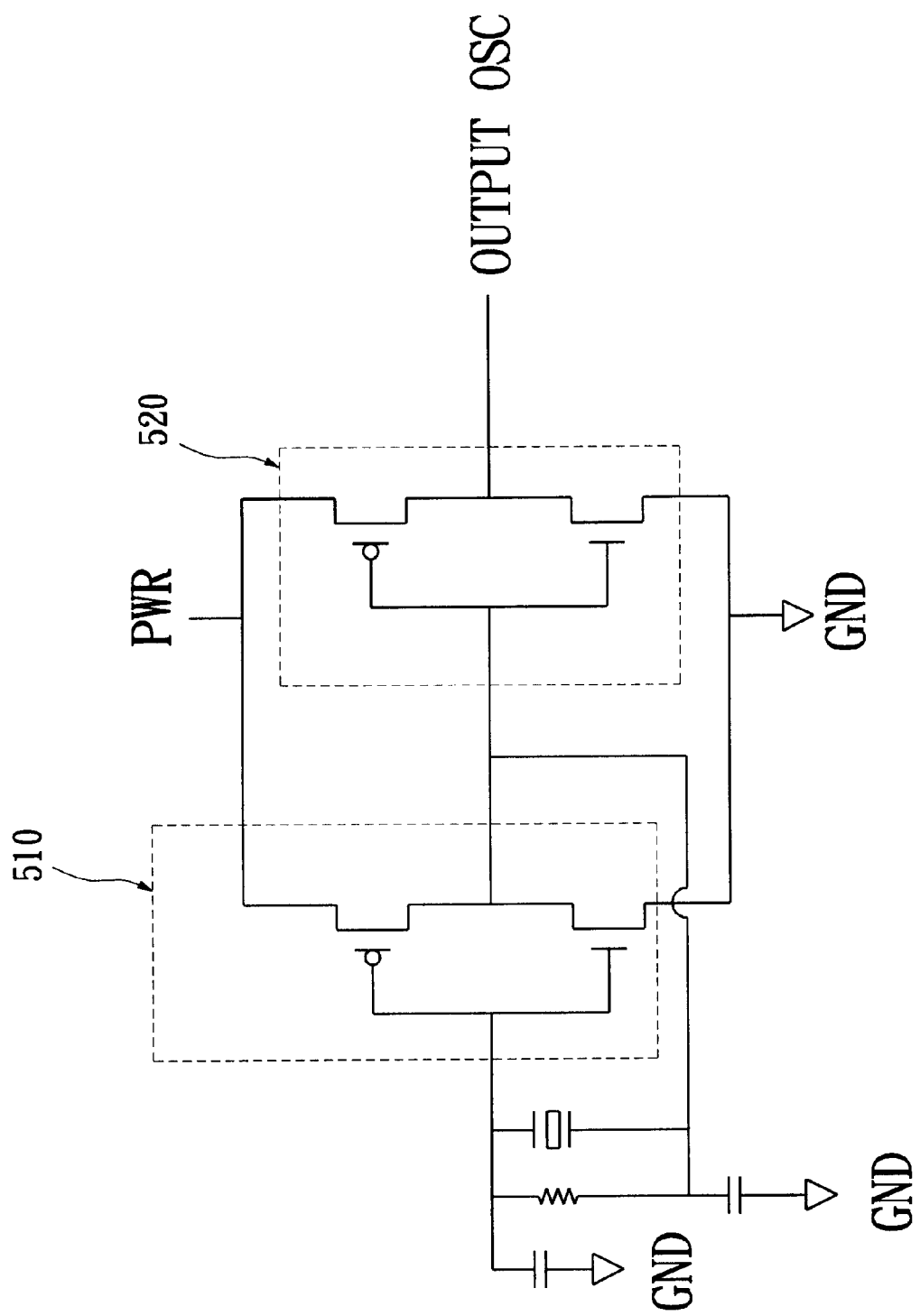
FIG. 5 shows a conventional crystal oscillator circuit.

FIG. 3A illustrates a preferred embodiment of the time-delay circuit that consists of a resistor 331. Another preferred embodiment of the time-delay circuit is formed by a PMOS transistor mp331 and an NMOS transistor mn331 connected in parallel as shown in FIG. 3B. In the first high frequency noise filtering circuit, the two gates of the two MOS transistors mp311 and mn311 are connected to the output of the intermediate amplifier 20.

With reference to FIG. 2, the output buffer 40 of the crystal oscillator circuit of this invention comprises a PMOS transistor mp41 and an NMOS mn41. The two gates of the two transistors mp41 and mn41 are connected respectively to the two ends of the time-delay circuit 33 in the high frequency noise filter 30. Thus, the two transistors are never turned on at the same time because of the time-delay circuit 33. The large short circuit problem of the conventional circuit is avoided. The output buffer 40 amplifies the filtered clock signal and provides high power to drive other circuits.

The power supply noise filter 50 consists of an RC circuit formed by a capacitor C51 and two resistors R51, R52. Before power is supplied to the oscillator gain stage 10 and the intermediate amplifier 20, the power supply noise filter 50 filters and removes the noise in the power and ground signals.

In a circuit composed of MOS transistors, the power consumed by the circuit can be computed by the formula $P=CV^2f$, where P is the power consumption, C is the load capacitance, f is the signal frequency and V is the voltage level of the peak to peak voltage swing in the circuit. By means of the voltage reduction circuit V11, the power supply voltage can be adjusted optimally to reduce the voltage swing in the inverter formed by the transistors mp11 and mn11 to an optimal value under a working condition in the oscillator gain stage 10. Because the voltage swing V is reduced, the power consumption P is also reduced significantly due to its square relation to the voltage.

As mentioned earlier, the PMOS transistor mp41 and the NMOS transistor mn41 are never turned on simultaneously. In the transition state of the clock signal and the switching state of the two MOS transistors mp41 and mn41, no large short current occurs. In addition, the power supply noise is filtered by the power supply noise filter 50 before the power is sent to the oscillator gain stage 10 and the intermediate amplifier 20. Furthermore, the high frequency noise filter 40 filters high frequency noise that may be contained in the clock signal before it is amplified by the output buffer. Therefore, the crystal oscillator circuit of this invention has high immunity to noise.

Although only the preferred embodiments of this invention were shown and described in the above description, numerous changes in the detailed construction and combination as well as arrangement of parts may be restored to without departing from the spirit or scope of the invention as hereinafter set forth in the appended claims. It is requested that any modification or combination that comes within the spirit of this invention be protected.

What is claimed is:

1. A clock signal circuit comprising:
   an oscillator gain stage having an inverter connected in series with a plurality of adjustable current limiting resistors and at least a voltage reduction circuit;
   an intermediate amplifier coupled to said oscillator gain stage;
   a high frequency noise filter coupled to said intermediate amplifier, said high frequency noise filter having first and second noise filtering circuits and a time-delay circuit connected to said second noise filtering circuit; and
   an output buffer coupled to said high frequency noise filter.

2. The clock signal circuit as claimed in claim 1 further comprising a power supply noise filter for filtering power supplied to said oscillator gain stage and said intermediate amplifier.

3. The clock signal circuit as claimed in claim 1, each of said adjustable current limiting resistors comprising a switching device in parallel with a resistor.

4. The clock signal circuit as claimed in claim 3, said switching device in an adjustable current limiting resistor being a manual switch.

5. The clock signal circuit as claimed in claim 3, said switching device in an adjustable current limiting resistor being a MOS transistor.

6. The clock signal circuit as claimed in claim 1, said intermediate amplifier having a PMOS transistor and an NMOS transistor.

7. The clock signal circuit as claimed in claim 1, said first filtering circuit in said high frequency noise filter having a PMOS transistor and an NMOS transistor.

8. The clock signal circuit as claimed in claim 1, said second filtering circuit in said high frequency noise filter having a PMOS transistor and an NMOS transistor.

9. The clock signal circuit as claimed in claim 1, said second noise filtering circuit having a pair of transistors connected to two ends of said time delay circuit.

10. The clock signal circuit as claimed in claim 9, said time delay circuit being a resistor.

11. The clock signal circuit as claimed in claim 9, said time delay circuit being a PMOS transistor and an NMOS transistor connected in parallel.

12. The clock signal circuit as claimed in claim 1, said output buffer having a PMOS transistor and an NMOS transistor connected respectively to two ends of said time-delay circuit.

13. A clock signal circuit comprising:
   an oscillator gain stage having an inverter formed by a PMOS transistor and an NMOS transistor, a plurality of adjustable current limiting resistors and at least a voltage reduction circuit, said inverter being in series with said plurality of adjustable current limiting resistors and said voltage reduction circuit;
   an intermediate amplifier having a PMOS transistor and an NMOS transistor coupled to said oscillator gain stage;
   a high frequency noise filter coupled to said intermediate amplifier, said high frequency noise filter having a first noise filtering circuit formed by a PMOS transistor and an NMOS transistor, a second noise filtering circuit formed by a PMOS transistor and an NMOS transistor, and a time-delay circuit connected to said second noise filtering circuit; and
   an output buffer having a PMOS transistor and an NMOS transistor coupled to said high frequency noise filter.

14. The clock signal circuit as claimed in claim 13 further comprising a power supply noise filter for filtering power supplied to said oscillator gain stage and said intermediate amplifier.

15. The clock signal circuit as claimed in claim 13, each of said adjustable current limiting resistors comprising at least a switching device and a resistor connected in parallel.

16. The clock signal circuit as claimed in claim 13, said switching device in an adjustable current limiting resistor being a manual switch.

17. The clock signal circuit as claimed in claim 13, said switching device in an adjustable current limiting resistor being a MOS transistor.

18. The clock signal circuit as claimed in claim 13, said time delay circuit being a resistor.

19. The clock signal circuit as claimed in claim 13, said time delay circuit being a PMOS transistor and an NMOS transistor connected in parallel.

* * * * *